(12) United States Patent
Fukushima et al.

(10) Patent No.: US 9,344,084 B2
(45) Date of Patent: May 17, 2016

(54) TOUCH SENSOR

(71) Applicant: U-SHIN LTD., Tokyo (JP)

(72) Inventors: Kazuyuki Fukushima, Aki-gun (JP); Tomo Kawase, Aki-gun (JP); Tetsuo Tokudome, Aki-gun (JP)

(73) Assignee: U-SHIN LTD., Tokyo (JP)

( * ) Notice: Subject to any disclaimer, the term of this patent is extended or adjusted under 35 U.S.C. 154(b) by 769 days.

(21) Appl. No.: 13/687,528

(22) Filed: Nov. 28, 2012

(65) Prior Publication Data

US 2013/0135033 A1   May 30, 2013

(30) Foreign Application Priority Data

Nov. 29, 2011   (JP) .................................. 2011-260393
Nov. 29, 2011   (JP) .................................. 2011-260763

(51) Int. Cl.
*H01H 35/00*     (2006.01)
*H03K 17/96*     (2006.01)

(52) U.S. Cl.
CPC .............. *H03K 17/96* (2013.01); *H03K 17/962* (2013.01); *H03K 2017/9602* (2013.01); *H03K 2217/96073* (2013.01)

(58) Field of Classification Search
CPC .................................................. H03K 17/962
USPC .......................................................... 307/116
See application file for complete search history.

(56) References Cited

U.S. PATENT DOCUMENTS

| | | | |
|---|---|---|---|
| 5,926,997 A * | 7/1999 | Wilcox | A01M 1/026 43/121 |
| 6,246,862 B1 * | 6/2001 | Grivas | H04M 1/0202 455/566 |
| 7,880,727 B2 * | 2/2011 | Abanami | G06F 3/03547 345/173 |

* cited by examiner

*Primary Examiner* — Stephen W Jackson
(74) *Attorney, Agent, or Firm* — Westerman, Hattori, Daniels & Adrian, LLP

(57) ABSTRACT

Provided is a touch sensor having a simple structure and enabling a driver to appropriately and quickly manipulate the touch sensor as intended without looking at a manipulation surface of the touch sensor. The touch sensor includes: multiple electrodes; detection means for detecting touch on any of electrodes and for outputting a detection signal for each electrode; touch judgment means for judging whether each of the electrodes is touched or untouched based on the detection signal; a switch having a manipulation button; control mode judgment means for determining a control function for a controlled device in accordance with an input signal transmitted from the switch when the manipulation button is manipulated; and permission means for permitting the touch judgment means to judge touch on each electrode in response to the input signal from the switch.

5 Claims, 6 Drawing Sheets

TOUCH SENSOR

BACKGROUND OF THE INVENTION

1. Field of the Invention

The present invention relates to a touch sensor configured to detect a user's touch on an electrode based on a change in the capacitance of the electrode.

2. Description of the Related Art

Japanese Patent Application Publication No. 2003-131760, for example, has proposed a structure to control various devices of a vehicle such as an air conditioner and an audio system by using a capacitive touch sensor. The structure is configured to read the trace of movement of a finger of an operator by using the touch sensor; judge which manipulation pattern the trace matches; and control the various devices based on an operation instruction matching the manipulation pattern.

SUMMARY OF THE INVENTION

However, in the structure proposed in Japanese Patent Application Publication No. 2003-131760, a power key for activating the touch sensor and a release key for selecting an operation mode are provided separately, and thus a large area is required to install these switches. In addition, without looking at the switches, an operator cannot distinguish the power-on switch from the others. To address this inconvenience, each portion to be manipulated as a manipulation key needs to be provided with surface level differences as a sign, and the operator is required to judge what function the manipulation key has on the basis of a shape formed by the surface level differences.

Further, since the driver has to manipulate two different manipulation keys, the driver needs to memorize what functions the respective manipulation keys have. For these reasons, the sensor is inevitably large in size, and complicated manipulation imposes larger burden on the operator. These cause a problem that the touch sensor cannot be installed easily as a general-purpose device.

In particular, when the touch sensor is provided on a steering wheel of a vehicle, an installation area thereof is small. If a large manipulation portion is provided there, the manipulation portion hinders the driver's steering operation. In addition, since the driver manipulates the touch sensor while driving the vehicle, the driver has difficulty in moving his/her finger in a wide range, and can take only simple manipulation actions. For these reasons, a simple manipulation system without multiple manipulation keys is desired.

Meanwhile, since the driver needs to manipulate the switches while driving the vehicle, the touch sensor is desired to perform quick processing according to the driver's intention without requiring the driver to look at the manipulation surface of the touch sensor.

The present invention has been made under the aforementioned circumstances, and aims to provide a touch sensor having a simple structure and enabling the driver to appropriately and quickly manipulate the touch sensor as intended without looking at a manipulation surface of the touch sensor.

For the purpose of attaining the foregoing object, a first aspect of the present invention is a touch sensor characterized in that the touch sensor includes: multiple electrodes; detection means for detecting touch on any of the electrodes and for outputting a detection signal for each electrode; touch judgment means for judging whether each of the electrodes is touched or untouched based on the detection signal; a switch having a manipulation button; control mode judgment means for determining a control function for a controlled device in accordance with an input signal transmitted from the switch when the manipulation button is manipulated; and permission means for permitting the touch judgment means to judge touch on each electrode in response to the input signal from the switch.

A second aspect of the present invention is the touch sensor of the first aspect of the present invention, characterized in that the touch sensor includes manipulation input judgment means for: setting a first one of the electrodes on which the touch is detected firstly by the touch judgment means as a start electrode; when touch on a second one of the electrodes is detected without detection of touch on the start electrode, resetting the start electrode, and newly setting as the start electrode the second electrode on which the touch is secondly detected; and judging a positional relationship between the new start electrode and the electrode on which the touch is firstly detected, and thereby determining a manipulation input mode of the controlled device.

A third aspect of the present invention is the touch sensor of the first or second aspect of the present invention, characterized in that at least two of the electrodes are arranged in an arc shape along an outer periphery of the manipulation button.

A fourth aspect of the present invention is the touch sensor of any one of the first to third aspects of the present invention, characterized in that after detection of touch on the start electrode, if no touch on the other electrode is detected within a predetermined time period, the detection means cancels touch detection on all the electrodes; and if touch on one of the electrodes is detected again later, the detection means sets the electrode as the start electrode.

A fifth aspect of the present invention is the touch sensor of anyone of the first to fourth aspects of the present aspect, characterized in that the touch sensor includes: a case including the electrodes and the switch which are arranged on a back side of the case, and provided with the manipulation button exposed to outside; and a recessed guide portion arranged in a region of a front surface of the case inside outer peripheries of the electrodes, the guide portion indicating where the electrodes are arranged.

According to the first aspect of the present invention, the touch sensor is not ready for detecting the touch on any of the electrodes until the driver manipulates the switch by using the manipulation button. Thus, the driver's accidental touch on the electrodes is not detected. This can reliably prevent unintentional operations due to an accidental touch on the electrodes. Further, since the detection of the touch on the electrode is permitted based on the input signal of the switch for selecting the control function for the controlled device, the touch sensor does not require a separately provided start switch. Thus, the structure can be simplified, and the touch sensor can be efficiently arranged in a narrow space. Further, since the switch is configured to select the control function for the controlled device and to be firstly manipulated whenever the manipulation is started, the driver can manipulate the switch in a single round of continuous manipulation without looking at the switch. The driver does not have to remember manipulation patterns, and can manipulate the switch easily.

According to the second aspect of the present invention, one of the electrodes to be focused can be identified by changing the start electrode as occasion demands. In addition, the direction of the driver's finger movement is judged to thereby determine the manipulation input mode of the controlled device. Thereby, the driver can perform intended the manipulation appropriately and quickly without looking at the manipulation surface. In addition, a control circuit for storing manipulation patterns is not required, and the driver does not have to remember the manipulation patterns. This provides advantageous effects such as the simplified structure and the reduction in the driver's burden.

According to the third aspect of the present invention, the provision of the switch as well as the touch sensor makes the menu selection easier. In addition, since the multiple electrodes are arranged in the arc shape along the manipulation button of the switch, the arrangement makes it easier to continuously operate any one of the electrodes by following the manipulation of the manipulation button. For example, in a case where the touch sensor is installed on the steering wheel, the driver manipulates the touch sensor while holding the steering wheel. To this end, the touch sensor can be arranged within a reach of the thumb of the driver which is a manipulating finger. This arrangement enables the driver to smoothly manipulate the manipulation button of the switch and the touch sensor without releasing the hand from the steering wheel.

According to the fourth aspect of the present invention, when the driver touches the start electrode and later does not touch any of the electrodes for a predetermined time period, the touch is judged as an accidental touch and thus the manipulation is cancelled. This can prevent unintentional operations of the touch sensor due to an accidental touch thereon.

According to the fifth aspect of the present invention, the guide portions of the touch sensor indicating the manipulation position are narrower in range than the electrodes. Thus, the touch on any of the guide portions of the electrodes can be reliably detected. In addition, the driver can reliably manipulate the electrodes A, B of the touch sensor while guided by the guide portions without looking at the operation parts.

DESCRIPTION OF THE PREFERRED EMBODIMENT

An embodiment of the present invention will be described below based on the attached drawings.

Figure 1:
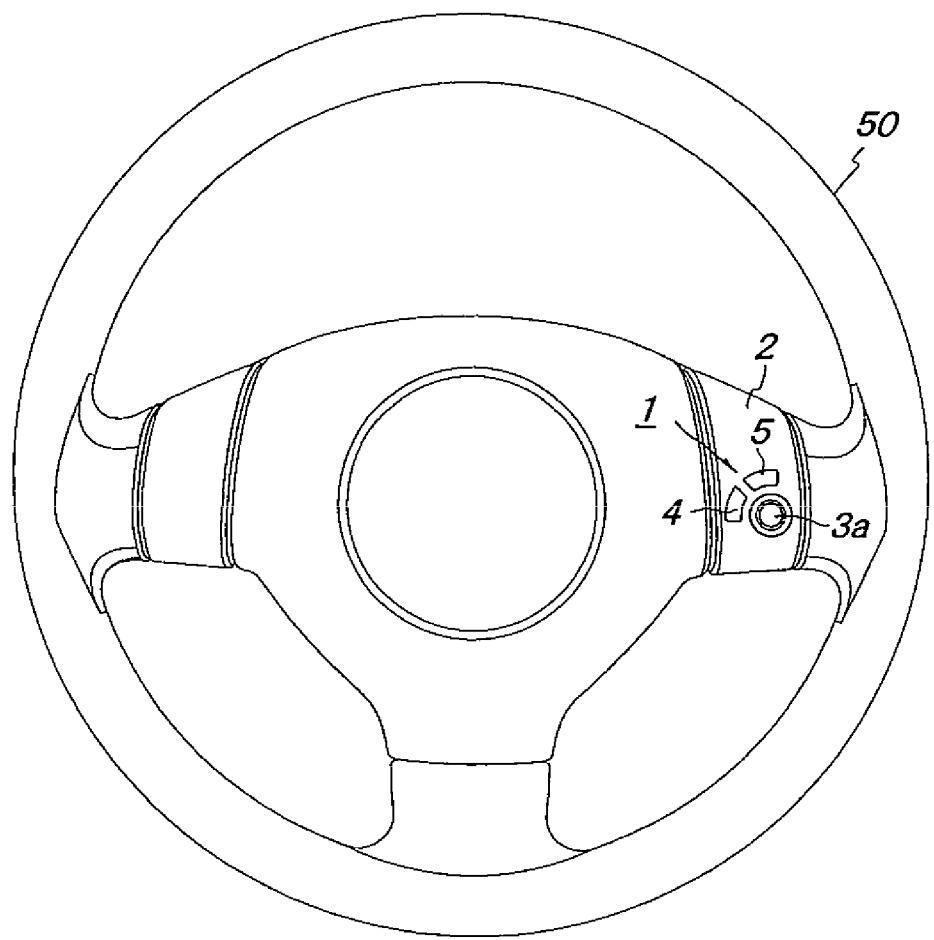
FIG. 1 is a front view of a steering wheel on which a touch sensor according to the present invention is installed.
Figure 2:
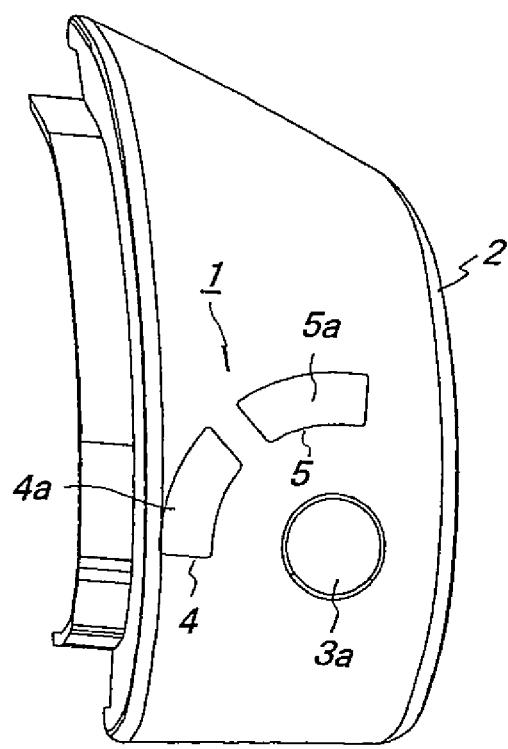
FIG. 2 is a front view of the touch sensor according to the present invention.
Figure 3:
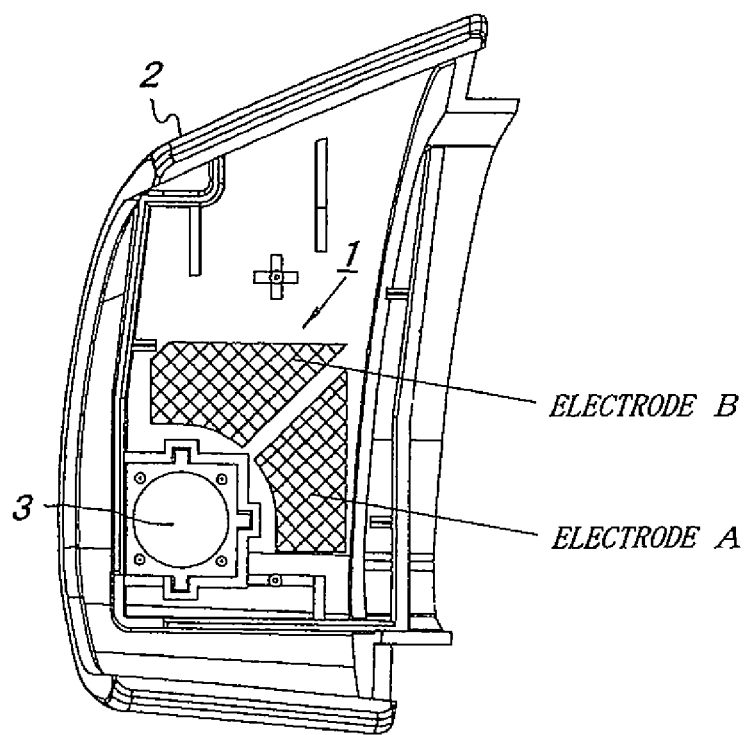
FIG. 3 is a back view of the touch sensor according to the present invention.

FIG. 1 is a front view of a steering wheel on which a touch sensor according to the present invention is installed; FIG. 2 a front view of the touch sensor; and FIG. 3 is a back view of the touch sensor. In this embodiment, the touch sensor 1 is installed on a steering wheel 50 of a vehicle with a case 2 placed in between, as shown in FIG. 1.

As shown in FIG. 3, a mode selection switch 3 which is a mechanical push switch and two electrodes A, B are arranged on the back side of the case 2. As shown in FIG. 2, a circular manipulation button 3a of the mode selection switch 3 is exposed to the outside from a surface of the case 2. As shown in FIG. 2, touch manipulation parts 4, 5 leading to the respective electrodes A, B are arranged on the surface of the case 2 in an arc shape along an outer periphery of the manipulation button 3a. Here, the mode selection switch 3 is a switch configured to select one of control modes (an audio mode, an air conditioner mode, a navigation mode, and the like) of devices to be controlled, such as an audio system, an air conditioner, and a navigation system. Tune selection and volume adjustment in the audio mode, temperature and airflow rate adjustments in the air conditioner mode, as well as menu selection in the navigation mode are carried out by manipulating the touch sensor 1. The two electrodes A, B have mutually different capacitances.

As shown in FIGS. 1 and 2, portions which are located inside outer peripheries of the respective touch manipulation parts 4, 5 exposed from the surface of the case 2 are formed as guide portions which are recessed from the surface portion in order to show the placement positions of the touch manipulation parts 4, 5. In this embodiment, the portions which are located inside outer peripheries of the respective touch manipulation parts 4, 5 are formed as two curved guide grooves 4a, 5a each shaped like a recessed square groove. A boundary portion between the electrodes A, B is flush with the surface portion of the case 2. Thus, when the driver moves the finger from the touch manipulation part 4 to the touch manipulation part 5, surface level difference between the boundary portion and each of the electrodes A, B enables the driver to distinguish manipulation strokes. Accordingly, the two of the guide grooves 4a, 5a of the respective touch manipulation parts 4, 5 are not necessarily formed, and may be unitarily formed as a single arc groove curving along the manipulation button 3a of the mode selection switch 3. In this case, the boundary portion between the electrodes A, B may have a different level from levels of the electrodes A, B so that the driver can distinguish manipulation strokes.

In this embodiment, the manipulation button 3a is formed to be lower than the surface portion of the case 2, and arranged in the center of a mortar-shaped recessed portion. With this structure, the manipulation button 3a does not hinder the manipulation of the touch manipulation parts 4, 5, and is not pressed by mistake.

In addition, as shown in FIGS. 2 and 3, the electrodes A, B are each made of a thin copper plate, and fixedly attached to the back side of the surface portion of the case 2. The widths of the guide grooves 4a, 5a of the touch manipulation parts 4, 5 are set smaller than those of the electrodes A, B. In other words, the guide grooves 4a, 5a are formed to be located within the electrodes A, B. With this structure, when the driver touches a portion within a range of the guide groove 4a or 5a with the finger, the corresponding electrode A or B always detects the touch.

Next, a circuit configuration of the touch sensor 1 according to the present invention will be described below based on FIG. 4.

Figure 4:
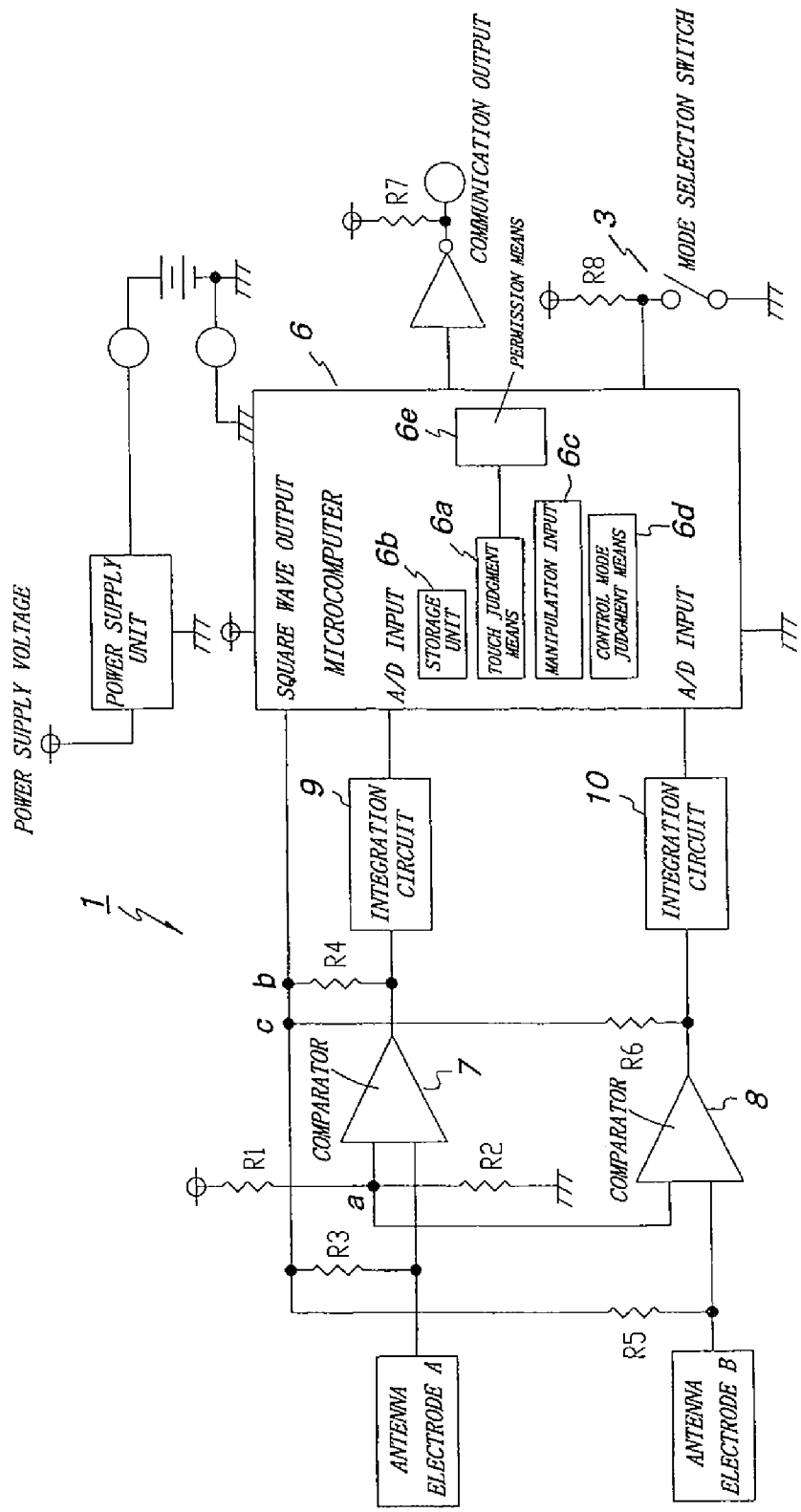
FIG. 4 is a circuit configuration diagram of the touch sensor according to the present invention.

FIG. 4 is a circuit configuration diagram of the touch sensor according to the present invention. The touch sensor 1 according to the present invention includes the two electrodes A, B; a microcomputer 6; resistors R1, R2; comparators 7, 8; integration circuits 9, 10; and the like. The two electrodes A, B have the mutually different capacitances. The microcomputer 6 has a function as an oscillator configured to output operating signals of periodic square waves, and to input the signals to the electrodes A, B through resistors R3, R5, respectively. The resistors R1, R2 are connected together in series in order to divide a direct-current power supply voltage VCC. Each of the comparators 7, 8 compares a potential (a reference voltage) Va at a point a between the resistors R1, R2 with an output voltage of a corresponding one of the electrodes A, B. If the output voltage of the corresponding electrode A or B is higher than the reference voltage Va, the corresponding comparator 7 or 8 turns OFF to output a predetermined voltage. If the output voltage of the electrode A or B is lower than the reference voltage Va, the corresponding comparator 7 or 8 turns ON not to output the predetermined voltage. Each of the integration circuits 9, 10 integrates the output from the corresponding comparator 7 or 8.

In this embodiment, the capacitances of the electrodes A, B are set mutually different. However, since the outputs of the electrodes A, B are connected to the respective input ports of the microcomputer 6, which one of the electrodes each input signal comes from may be judged by identifying the input port. In this case, the electrodes A, B may be formed from electrodes having the same capacitance.

The microcomputer 6 constitutes a controller. The microcomputer 6 detects touch on any of the electrodes A, B, and outputs a control signal for controlling a controlled device according to a touched state of the electrode A or B. To this end, the microcomputer 6 includes touch judgment means 6a, manipulation input judgment means 6c, control mode judgment means 6d, and a storage unit 6b all of which are incorporated in the microcomputer 6. The touch judgment means 6a judges which one of the electrodes A, B is touched or untouched based on the detection signal. When the touch judgment means 6a detects the touch on one of the electrodes A, B, the manipulation input judgment means 6c judges which one of the electrodes A, B causes the detection signal, and determines a manipulation input mode (an upward manipulation mode or a downward manipulation mode in this embodiment) based on the order of touching the electrodes A, B and the duration of touch. The control mode judgment means 6d determines an operation input mode of a controlled device according to the manipulation of the mode selection switch 3. The storage unit 6b stores the manipulation input mode determined by the manipulation input judgment means 6c and the operation input mode concerning the function of controlling the controlled device (such as the audio system, the air conditioner, or the navigation system, or the like) determined by the control mode judgment means 6d.

The mode selection switch 3 is connected to the microcomputer 6, and the microcomputer 6 is provided with permission means 6e for permitting the touch judgment means 6a to detect the touch on the electrode A or B upon receipt of an input signal from the mode selection switch 3. To this end, the control mode judgment means 6d and the permission means 6e are configured to receive the input signal from the mode selection switch 3, and the touch judgment means 6a is configured to be permitted to detect the touch on the electrode A or B depending on a permission signal from the permission means 6e. That is to say, the mode selection switch 3 is configured to perform a function of a touch-detection trigger switch. In addition, output ports of the respective comparators 7, 8 are connected to contact points b, c between the microcomputer 6 and the resistors R3, R5 through resistors R4, R6. In other words, the output ports of the comparators 7, 8 are connected to the microcomputer 6. The comparators 7, 8 use square-wave output from the microcomputer 6 as a pull-up power supply.

Incidentally, the touch judgment means 6a may have the function of the permission means 6e. The touch judgment means 6a may be configured to start the touch detection by being triggered by the signal from the mode selection switch 3. Further, the microcomputer 6 may be configured to be put in a sleep mode until otherwise instructed, and to be activated upon receipt of the input signal from the mode selection switch 3. In this case, the mode selection switch 3 performs the function as a switch for activating the microcomputer 6.

Next, a principle of the detection performed by the touch sensor 1 according to the present invention will be described below based on FIGS. 5A and 5B.

Figure 5:
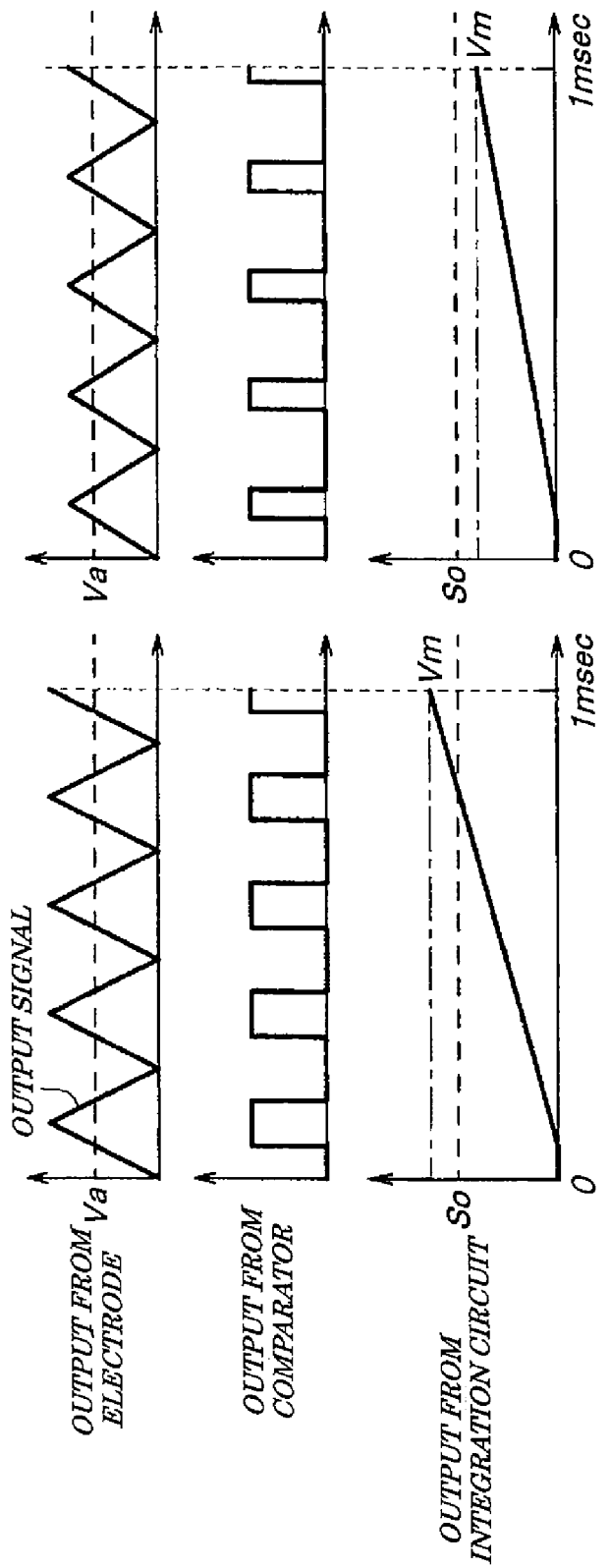
FIG. 5A and FIG. 5B are graphs showing changes in output from each of electrodes of the touch sensor according to the present invention between touched and untouched states.

FIGS. 5A and 5B are graphs each showing changes which are observed in the output from each of electrodes A, B of the touch sensor 1 according to the present invention when the touch sensor 1 is touched and untouched. Each of the electrodes A, B distorts an operating voltage by using its own electrostatic capacitance. Hence, an output signal from each of the electrodes A, B turns into a voltage signal having a waveform similar to saw teeth (illustrated as a complete triangular wave in FIG. 5), which results from distorting the square wave received from the microcomputer 6.

Each of the comparators 7, 8 outputs a voltage only when the output (output signal) from the corresponding electrode A or B is higher than the voltage (the reference voltage) Va at the point a. Since each of the integration circuits 9, 10 integrates the output of the corresponding comparator 7 or 8, the output increases almost linearly with the elapse of time. The gradient of the increase in the output is proportional to a duty ratio (the proportion of the duration of ON to a pulse period) of the comparators 7 or 8.

Hence, the microcomputer 6 obtains a detection value Vm by digitally converting an output voltage from each of the integration circuits 9, 10 which has carried out the integration for 1 msec since the start of the integration, and stores the detection value Vm in the storage unit 6b. The comparators 7, 8, the integration circuits 9, 10, and the microcomputer 6 function as a detection circuit configured to generate the detection value Vm according to a difference between the output signal from the electrode A or B and the reference voltage Va at the point a.

Because the amplitude of the output signal from the electrode A or B is larger as shown in FIG. 5A while the finger of the driver is not in contact with the electrode A or B, a length of time during which the voltage of the output signal (the output voltage) from the electrode A or B is equal to or higher than the reference voltage Va is relatively longer. For this reason, the corresponding comparator 7 or 8 has a higher duty ratio of the output voltage, and the corresponding integration circuit 9 or 10 has a higher ascending gradient of the output voltage and thus has a higher voltage 1 msec after the start of the integration. Accordingly, the microcomputer 6 obtains a larger detection value Vm.

In response to this, the touch judgment means 6a of the microcomputer 6 compares the detection value Vm with a threshold So stored in the storage unit 6b in the microcomputer 6. When the detection value Vm is equal to or higher than the threshold So, the touch judgment means 6a judges that the finger of the driver has not been in contact with the electrode A or B and outputs an OFF signal to the outside.

On the other hand, once the finger of the driver touches the electrode A or B, the electrode A or B has an increased capacitance. Accordingly, the amplitude of the output signal from the electrode A or B becomes smaller as shown in FIG. 5B than in the case where the finger of the driver is not in contact with the electrode A or B as shown in FIG. 5A. For this reason, a length of time during which the voltage of the output signal from the electrode A or B is equal to or higher than the reference voltage Va; the corresponding comparator 7 or 8 has a lower duty ratio of the output voltage; and the corresponding integration circuit 9 or 10 has a lower ascending gradient of the output voltage and thus has a lower voltage 1 msec after the start of integration. Accordingly, the microcomputer 6 obtains a smaller detection value Vm.

In response to this, the touch judgment means 6a of the microcomputer 6 compares the detection value Vm with the threshold So stored in the storage unit 6b in the microcomputer 6. When the detection value Vm becomes equal to or lower than the threshold So, the touch judgment means 6a judges that the finger of the driver is in contact with the electrode A or B and outputs an ON signal to the outside.

Next, an operation flow of the touch sensor 1 according to the present invention will be described below based on FIG. 6.

Figure 6:
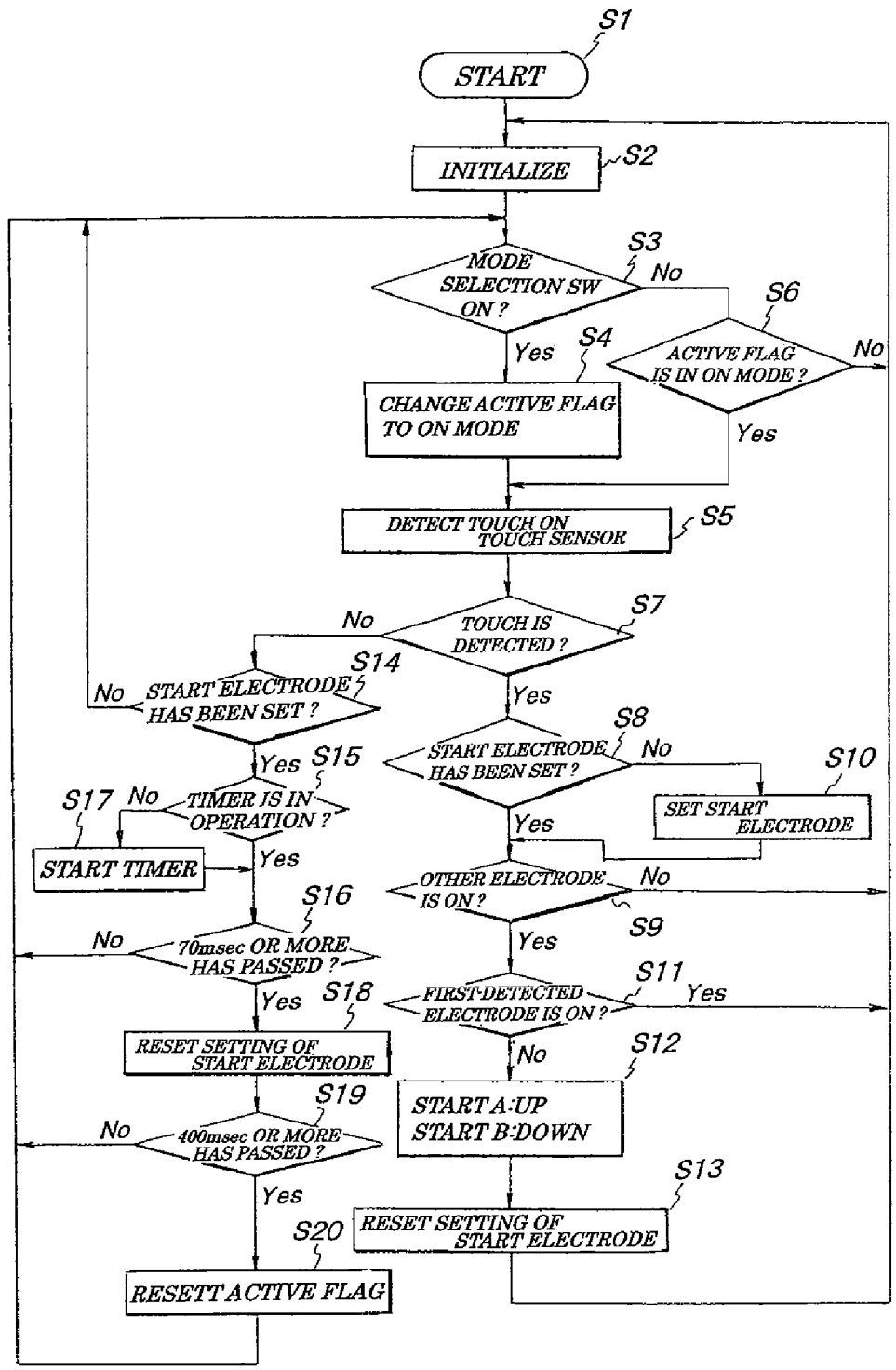
FIG. 6 is a flowchart showing an operation flow of the touch sensor according to the present invention.

FIG. 6 is a flowchart showing the operation flow of the touch sensor 1. In the touch sensor 1 installed on the steering wheel 50 shown in FIG. 1, once the touch judgment means 6a provided to the microcomputer 6 detects the touch on the electrode A (B), the manipulation input judgment means 6c sets, as a start electrode, the electrode A (B) on which the touch is detected firstly. Then, once the touch on the other electrode B (A) is detected with no touch on the start electrode A (B) detected, the manipulation input judgment means 6c cancels the setting of the electrode A (B) as the start electrode, and newly sets, as the start electrode, the electrode B (A) on which the touch is secondly detected. Then, the manipulation input judgment means 6c judges a positional relationship with the newly-set start electrode and the electrode A (B) on which the touch is detected firstly, and thereby determines an operation input mode of the controlled device.

In addition, when touch on the other electrode B (A) is not detected within a predetermined time after the electrode A (B) is set as the start electrode upon detection the touch thereon, the microcomputer 6 cancels all the detections of touch on the electrodes A, B. When the mode selection switch 3 is thereafter pressed and when touch on the electrode A (B) is detected again, the microcomputer 6 sets the electrode A (B) as the start electrode.

To put it differently, as shown in FIG. 6, once the operation of the touch sensor 1 starts (step S1), initialization is executed (step S2). It is judged whether or not the driver turns ON the mode selection switch 3 in the first place (step S3). That is to say, unless the mode selection switch 3 is pressed, the touch on any of the electrodes A, B is designed not to be detected. Thereby, even if the driver touches any one of the electrodes A, B of the touch sensor 1 by mistake while steering the steering wheel 50, unintentional operations such as changing the setting of any controlled device can be prevented. Thereafter, in a case where, for example, the air conditioner mode is selected through the selection judgment on the audio mode, the air conditioner mode and the like by further pressing the mode selection switch 3, the changing of the air flow rate and the temperature, and the switching between outside air and inside air, are selected by use of the mode selection switch 3.

If the mode selection switch 3 is pressed by the driver and thereby turns ON (if the result of the judgment is Yes in step S3), an active flag (a flag indicating ON/OFF of the mode selection switch 3) is changed to an ON mode (step S4), and the detection of the driver's touch on any of the electrodes A, B of the touch sensor 1 is started (step S5).

On the other hand, if the mode selection switch 3 is not pressed by the driver and thus is OFF (if the result of the judgment is No in step S3), it is judged whether or not the active flag is in the ON mode (step S6). If the mode selection switch 3 is already pressed and the active flag is already set to the ON mode (if the result of the judgment is Yes in step S6), the detection of the driver's touch on any one of the electrodes A, B of the touch sensor 1 is started (step S5). In contrast, if the active flag is set to an OFF mode (if the result of the judgment is No in step S6), the process returns to step S2 because the mode selection switch 3 is not pressed even once by the driver. In sum, in a state where the mode selection switch 3 is not pressed, the touch on the touch sensor 1 is not detected by the microcomputer 6.

In detecting the driver's touch on any one of the electrodes A, B of the touch sensor 1, it is judged whether or not the finger of the driver touches any one of the electrodes A, B (the electrode A, for example) (step S7). If the touch is detected (if the result of the judgment is Yes in step S7), it is then judged whether or not the start electrode has been set (step S8). If the start electrode has been set (if the result of the judgment is Yes in step S8), it is judged whether or not the driver touches the other electrode (the electrode B, for example) (ON) (step S9). In this respect, for example, if the touch on the other electrode B is not detected after the touch on the electrode A is detected, the setting of the electrode A as the start electrode is cancelled (reset) after the elapse of 400 msec. When the touch on the electrode A or B is detected again, the detected electrode A or B is set as the start electrode. If No start electrode has been set yet (if the result of the judgment is No in step S8), the electrode A or B on which the touch is detected (the electrode B, for example) is set as the start electrode (step S10).

If the touch on the electrode (the electrode B) other than the electrode (the electrode A) on which the touch is firstly detected is detected (if the result of the judgment is Yes in step S9), it is judged whether or not the first-detected electrode A (B) is in a touched (ON) state. In other words, it is judged whether or not any of the following situations occurs: after the electrode A, for example, turns ON and then OFF, the other electrode B turns ON and the electrode A also turns ON; and both the electrodes A, B are simultaneously touched (ON) (simultaneously pressed) (step S11). If both of the electrodes A, B are simultaneously touched (ON) (if the result of the judgment is Yes in step S11), the output of the microcomputer 6 becomes OFF because the direction of the driver's manipulation is uncertain, and the setting of the start electrode is canceled.

If the first-detected electrode A (B) is not in the touched (ON) state (if the result of the judgment is No in step S11), the following judgments are performed. If the electrode A is set as the start electrode and if the touch on the electrode B (ON) is detected (if the finger of the driver moves from the electrode A to the electrode B), it is judged that the upward manipulation is made (for example, the airflow rate and the temperature of the air conditioner is to be increased; or the cursor is moved in one direction, for example, upward in the mode selection). On the other hand, if the electrode B is set as the start electrode and if the touch on the electrode A (ON) is detected (if the finger of the driver moves from the electrode B to the electrode A), it is judged that the downward manipulation is judged (for example, the airflow rate and the temperature of the air conditioner is to be decreased; or the cursor is moved in the other direction, for example, downward in the mode selection) (step S12). Thereafter, the setting of the start electrode is reset (step S13), and the process returns to step S2. In this respect, in a case where, for example, the driver twice repeats the manipulation in which the driver moves the finger from the electrode A to the electrode B with an interval of releasing the finger between the manipulations, if the OFF time during which the finger is not in contact is shorter than 70 msec, it is judged that the driver moves the finger from the electrode A to the electrode B and then from the electrode B to the electrode A. On the other hand, if the OFF time is 70 msec or longer, it is judged that the driver moves the finger from the electrode A to the electrode B and again from the electrode A to the electrode B. Incidentally, if the second electrode turns ON and the ON state lasts, the cursor may be continuously moved upward or downward in the judged manipulation direction. In this case, the scrolling speed may be increased gradually.

Meanwhile, if no touch on the electrode A or B is detected although the mode selection switch 3 is pressed (if the result of the judgment is No in step S7), it is judged whether or not the start electrode has been set (step S14). If the start electrode has been set (if the result of the judgment is Yes in step S14), it is judged whether or not a timer is in operation (step S15). If the start electrode has not been set (if the result of the judgment is No in step S14), the process returns to step S3.

If the start electrode has been set and if the timer is in operation (if the result of the judgment is Yes in step S15), it is judged whether or not a time of 70 msec or longer has passed (step S16). If the timer is not in operation (if the result of the judgment is No in step S15), the timer is started (step S17), and then it is judged whether or not the time of 70 msec or longer has passed (step S16).

If the time of 70 msec or longer passes (if the result of the judgment is Yes in step S16), the setting of the start electrode is reset (step S18). Until the time of 70 msec or longer passes (as long as the result of the judgment is No in step S16), the process returns to step S3.

If the time of 70 msec or longer passes and if the setting of the start electrode is reset (step S18), it is judged whether or not a time of 400 msec or longer has passed (step S19). If the time of 400 msec or longer passes (if the result of the judgment is Yes in step S19), the active flag is reset (step S20). Until the time of 400 msec or longer passes (as long as the result of the judgment is No in step S19), the process returns to step S3.

The touch sensor 1 of this embodiment, which operates as described above, is capable of identifying the electrode A (B) to be focused by changing the start electrode as occasion demands, and determines the control mode of on-vehicle equipment such as the audio system or the air conditioner by judging the direction of the movement of the driver's finger. Thereby, the driver can perform intended manipulation appropriately and quickly without looking at a manipulation surface. In addition, a control circuit for storing manipulation patterns is not required, and the driver does not have to remember the manipulation patterns. This provides advantageous effects such as a simplified structure and a reduction in the driver's burden.

The touch sensor 1 of this embodiment clearly separates: the function which the mode selection switch 3 fulfills in selecting a control function for any controlled device; and the selection function which the electrodes A, B of the touch sensor 1 apply to the selected control function. This makes the menu selection easier, and enables the driver to perform subsequent adjustment and selection by moving the finger along the guide portions of the touch sensor 1. Thus, the driver can easily distinguish the manipulation of the manipulation button 3*a* and the manipulation of the touch manipulation parts 4, 5 (the electrodes A, B) from each other without looking at the manipulation parts 4, 5.

In addition, the touch sensor 1 is configured in the way that even if the driver touches the electrode A or B, the touch on the electrode A or B of the touch sensor 1 is not detected until the driver presses the mode selection switch 3. This can reliably prevent unintentional operations due to an accidental touch on the electrodes A, B. Further, the touch sensor 1 does not require a start switch for starting the touch detection to be separately provided, and thus can have efficient component arrangement using a small space and enabling prevention of an unintentional operation.

Moreover, the multiple touch manipulation parts 4, 5 (the electrodes A, B) are arranged in an arc shape along the periphery of the manipulation button 3*a* of the mode selection switch 3. The arrangement makes it easier to continuously manipulate any one of the touch manipulation parts 4, 5 (the electrodes A, B) by following the manipulation of the manipulation button 3*a*. In particular, in the case where the touch sensor 1 is installed on the steering wheel 50, the driver manipulates the touch sensor 1 while holding the steering wheel 50. For this reason, the touch sensor 1 can be arranged within a reach of the thumb of the driver which is a manipulating finger. This arrangement enables the driver to smoothly manipulate the push-type mode selection switch 3 and the touch sensor 1 without releasing the hand from the steering wheel 50.

Further, the touch sensor 1 according to this embodiment is configured such that if the driver touches none of the electrodes A, B for a predetermined time period after touching any one of the electrodes A, B, the touch is judged as unintentional touch and thus the manipulation is cancelled. This can prevent an unintentional operation of the touch sensor 1 due to an accidental touch thereon. Incidentally, the touch sensor 1 may also be configured such that when the driver keeps touching the electrode A or B for a predetermined time period or longer, the touch is judged as unintentional touch and thus the manipulation is cancelled.

Furthermore, in this embodiment, the guide portions of the touch sensor 1 indicating the manipulation position are narrower in range than the touch manipulation parts 4, 5 (the electrodes A, B). Thus, the touch on any of the guide portions of the touch manipulation parts 4, 5 (the electrodes A, B) can be reliably detected. In addition, the driver can reliably manipulate the touch manipulation parts 4, 5 (the electrodes A, B) of the touch sensor 1 while guided by the guide portions without looking at the touch manipulation parts 4, 5.

Here, the two curved and rectangular guide portions are formed separately in this embodiment. Instead, however, a single long curved portion may be formed which has tangible surface level differences in the boundary between each of the electrodes A, B. As long as the guide portions are formed in the arc shape along the manipulation button 3*a* and enable the driver to feel the movement of the finger to any one of the electrodes A, B, the guide portions may have a shape other than the rectangle.

The foregoing description has been given of the mode in which the touch sensor 1 according to the present invention is installed on the steering wheel 50 of the vehicle. However, it goes without saying that the touch sensor 1 according to the present invention may be installed on any other portion.

What is claimed is:

1. A touch sensor comprising:
a plurality of electrodes;
detection means for detecting touch on any of the electrodes and for outputting a detection signal for each electrode;
touch judgment means for judging whether each of the electrodes is touched or untouched based on the detection signal;
a switch having a manipulation button;
control mode judgment means for determining a control function for a controlled device in accordance with an input signal transmitted from the switch when the manipulation button is manipulated;
permission means for permitting the touch judgment means to judge touch on each electrode in response to the input signal from the switch;
manipulation input judgment means for:
  setting a first one of the electrodes on which the touch is detected firstly by the touch judgment means as a start electrode;

when touch on a second one of the electrodes is detected without detection of touch on the start electrode, resetting the start electrode, and newly setting as the start electrode the second electrode on which the touch is secondly detected; and judging a positional relationship between the new start electrode and the electrode on which the touch is firstly detected, and thereby determining a manipulation input mode of the controlled device, wherein at least two of the electrodes are arranged in an arc shape along an outer periphery of the manipulation button, and wherein after detection of touch on the start electrode,
if no touch on the other electrode is detected within a predetermined time period, the detection means cancels touch detection on all the electrodes, and if touch on one of the electrodes is detected again later, the detection means sets the electrode as the start electrode;

a case including the electrodes and the switch which are arranged on a back side of the case, and provided with the manipulation button exposed to outside; and a recessed guide portion arranged in a region of a front surface of the case inside outer peripheries of the electrodes, the guide portion indicating where the electrodes are arranged.

2. The touch sensor comprising:

a plurality of electrodes;

detection means for detecting touch on any of the electrodes and for outputting a detection signal for each electrode;

touch judgment means for judging whether each of the electrodes is touched or untouched based on the detection signal;

a switch having a manipulation button;

control mode judgment means for determining a control function for a controlled device in accordance with an input signal transmitted from the switch when the manipulation button is manipulated;

permission means for permitting the touch judgment means to judge touch on each electrode in response to the input signal from the switch; and manipulation input judgment means for:
setting a first one of the electrodes on which the touch is detected firstly by the touch judgment means as a start electrode;

when touch on a second one of the electrodes is detected without detection of touch on the start electrode, resetting the start electrode, and newly setting as the start electrode the second electrode on which the touch is secondly detected; and judging a positional relationship between the new start electrode and the electrode on which the touch is firstly detected, and thereby determining a manipulation input mode of the controlled device.

3. The touch sensor according to claim 2, wherein at least two of the electrodes are arranged in an arc shape along an outer periphery of the manipulation button.

4. The touch sensor according to claim 2, wherein
after detection of touch on the start electrode,
if no touch on the other electrode is detected within a predetermined time period, the detection means cancels touch detection on all the electrodes, and if touch on one of the electrodes is detected again later, the detection means sets the electrode as the start electrode.

5. The touch sensor according to claim 2, comprising:
a case including the electrodes and the switch which are arranged on a back side of the case, and provided with the manipulation button exposed to outside; and a recessed guide portion arranged in a region of a front surface of the case inside outer peripheries of the electrodes, the guide portion indicating where the electrodes are arranged.

* * * * *